(12) United States Patent
Hassner et al.

(10) Patent No.: US 6,344,807 B1
(45) Date of Patent: Feb. 5, 2002

(54) PACKET-FRAME GENERATOR FOR CREATING AN ENCODED PACKET FRAME AND METHOD THEREOF

(75) Inventors: Martin Hassner, Mountain View; Nyles Heise, San Jose, both of CA (US); Walter Hirt, Wettswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/667,260

(22) Filed: Sep. 22, 2000

(30) Foreign Application Priority Data

Sep. 24, 1999 (EP) .............................. 99810859

(51) Int. Cl.[7] .............................. H03M 5/00; H03M 7/00
(52) U.S. Cl. .......................................... 341/59; 341/58
(58) Field of Search ..................... 341/58, 59; 375/240; 370/425

(56) References Cited

U.S. PATENT DOCUMENTS 5,920,272 A * 7/1999 Immink ........................ 341/59
6,052,072 A * 4/2000 Tsang et al. ................... 341/59

* cited by examiner

*Primary Examiner*—Patrick Wamsley
(74) *Attorney, Agent, or Firm*—Douglas W. Cameron; Anne Vachon Dougherty

(57) ABSTRACT

A packet-frame generator for creating an encoded packet frame comprising encoded control data and encoded utilizable data. A non-encoded packet frame comprising non-encoded control data and non-encoded utilizable data is providable by an assembling means. The packet-frame generator comprises a modulation encoder for encoding the non-encoded control data by a first modulation code and the non-encoded utilizable data by a second modulation code thereby providing the encoded packet frame.

20 Claims, 2 Drawing Sheets

US 6,344,807 B1

PACKET-FRAME GENERATOR FOR CREATING AN ENCODED PACKET FRAME AND METHOD THEREOF

FIELD OF THE INVENTION

The present invention is related to a packet-frame generator and a method for creating an encoded packet frame. More particularly, the invention relates to the generation of encoded packet frames for transmission over a channel, preferably a wireless channel.

BACKGROUND OF THE INVENTION

Although the present invention is applicable in a variety of applications it will be described with the focus on infrared links for wireless infrared data transmission. According to the Infrared Data Association (IrDA) standard for the IrDA Serial Infrared Physical Layer Specification to support a 16 Mb/s data rate extension, also referred to as Very Fast Infrared (VFIR), a so-called HHH(1,13) modulation code shall be applied.

The generation of packet frames as defined by the mentioned IrDA-VFIR (16 Mb/s) Physical Layer Specification by conventional methods and apparatuses show some drawbacks. For instance, the complete packet frame can only be created and assembled by hardware. Thus, a number of control signals and a complex design is required. The conventional methods for packet-frame generation use mixed multiplexing of different specified modulation patterns (e.g., preamble and delimiters) and modulation encoded data fields (e.g., IrLAP frame, CRC field) to assemble the packet frames in the modulation signal domain for subsequent transmission. The specified modulation patterns must be stored in several memory cells. Generally, at least two types of multiplexers, one for partial assembly of data related fields in the data input domain of the modulation encoder, i.e. in front of the modulation encoder, and a second one for the final assembly of the packet frame in the modulation signal domain, i.e. after the modulation encoder, are required. Commonly, some or all of the modulation signal fields are specific to violate the rules of the modulation code applied to the user data, which is regarded as random.

Hence, a scheme that allows an efficient generation of modulation signal streams is required. It also calls for a new efficient method and generator for creating an encoded packet frame.

It is an object of the present invention to overcome the disadvantages of the prior art and to reduce the packet-frame generator implementation complexity.

It is another object of the present invention to provide a method for creating an encoded packet frame in an efficient and variable manner, whereby the creation can be either on the software level, the hardware level, or a combination thereof.

It is still another object of the present invention to provide a packet-frame generator for creating an encoded packet frame that allows the assembly of entire packet frames in the data input domain of the modulation encoder.

It is a further object of the present invention to present a method for creating an encoded packet frame, whereby the created frame fields fulfill the rules of the modulation code.

SUMMARY OF THE INVENTION

These objects of the invention are achieved by the invention which comprises a system and method that allows efficient generation of modulation signal streams comprising encoded packet frames which are composed of certain specified modulation signal fields or frame fields including utilizable data in (random) data fields.

The proposed scheme unites two codes in a Composite Modulation Code, hereafter abbreviated to CMC, where two encoding functions can be implemented using the same set of encoder circuitry. The construction of such a CMC is based on partitioning and look-ahead techniques. A new and efficient method is disclosed that allows assembly of entire packet frames prior to encoding, which means in the data input domain of the modulation encoder. Packet frames in the data input domain are non-encoded packet frames. In particular, in the following it is disclosed how a conventional HHH(1,13) modulation encoder can be modified into a CMC encoder such that it generates a complete encoded packet frame by encoding an equivalent data input frame or non-encoded packet frame.

For this purpose, equivalent data input sequences are defined that produce the specified modulation signal patterns (e.g., preamble, delimiters) after passing them through the CMC encoder. The CMC encoder implements the dual-mode functions as defined by the CMC with a common set of hardware circuitry that includes a Composite Encoder State Machine (CESM). In particular, the basic HHH(1,13) code is modified into a dual-mode CMC such that it generates the complete encoded packet frame by encoding the mentioned equivalent data input frame or non-encoded packet frame.

The scheme for creating an encoded packet frame comprising encoded control data and encoded utilizable data operates as follows. At first, non-encoded control data and non-encoded utilizable data can be assembled into the non-encoded packet frame by an assembling means, preferably by just one multiplexer and/or discrete logic. Then, the non-encoded control data can be encoded by a first modulation code and the non-encoded utilizable data can be encoded by a second modulation code by use of an appropriate encoder, e.g., the CMC encoder, that comprises the first and second modulation code, preferably an AHM(1,7) code and the HHH(1,13) code. Finally, such a CMC encoder provides at its output the encoded packet frame comprising encoded control data and the encoded utilizable data for further processing, that means in the case of wireless infrared data transmission for direct transmission.

Application of the partitioning and look-ahead principles in the design of the CMC together with the proposed scheme's capability to assemble entire packet frames in the data input domain—instead of the modulation signal domain as done conventionally—offers several practical advantages, e.g., generally lower implementation complexity, such as reduction in the number of memory cells to store specific signal patterns (e.g., preamble, delimiters), fewer and narrower multiplexers, and smaller number of control signals. Furthermore, the means used to assemble a complete data input frame or non-encoded packet frame can be implemented either at a) the software level (processor implementable), b) the hardware level (combinatorial logic implementation), c) or by a combination of a) and b).

A processing system comprises at least a processor or processing logic. Typical processing systems are computers, peripheral devices, hand-held devices, cellar phones, and so forth.

If different frame fields can be completely assembled to the non-encoded packet frame before encoding, then the advantage occurs, that the non-encoded packet frame can be created completely by use of software since no further frame fields are necessary to be added to the encoded packet frame after encoding. This reduces the complexity of circuitry that otherwise would be required.

It shows advantageously that the assembling means can be realized in form of a computer program or software, because such a program can be adapted to the respective application accordingly. Further, no complex circuitry needs to be built or designed.

When the first modulation code is a run-length-limited (1,7) code comprising eight codewords and the second modulation code is a run-length-limited (1,13) code comprising fourteen codewords, than the advantage occurs that the second modulation code can be reduced to the first modulation code, preferably by using the eight codewords which are part of the fourteen codewords. It shows further advantageously that the modulation encoder then comprises a mapping table for at least the second modulation code.

The present invention is not restricted to infrared applications only and can be implemented in a variety of application fields, such as in magnetic recording systems, for example.

BRIEF DESCRIPTION OF THE DRAWINGS

The invention is described in detail below with reference to the following schematic drawings.

DETAILED DESCRIPTION OF THE INVENTION

Figure 1:
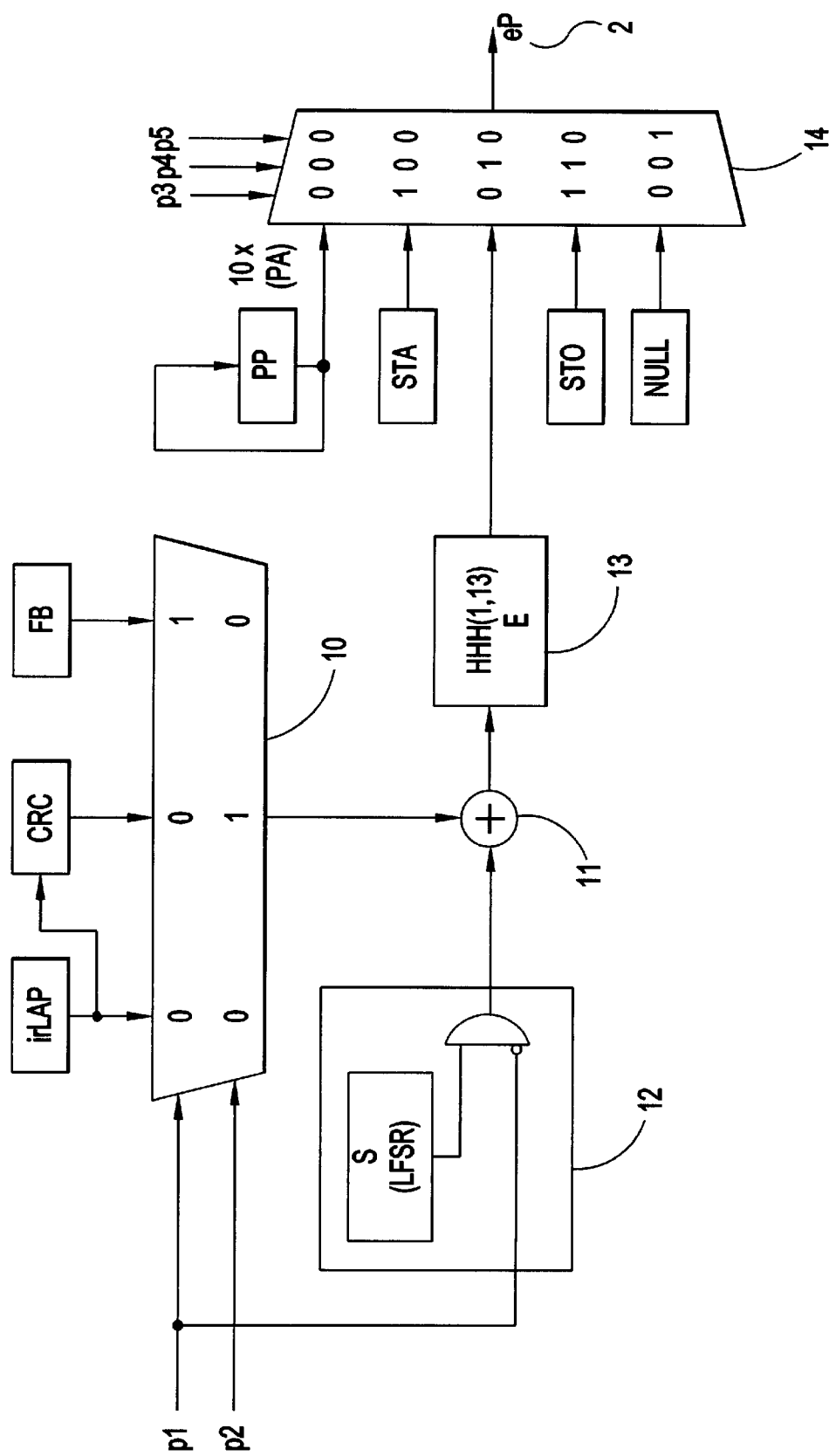
FIG. 1 shows a schematic illustration of a basic conventional scheme for packet frame assembly.
Figure 2:
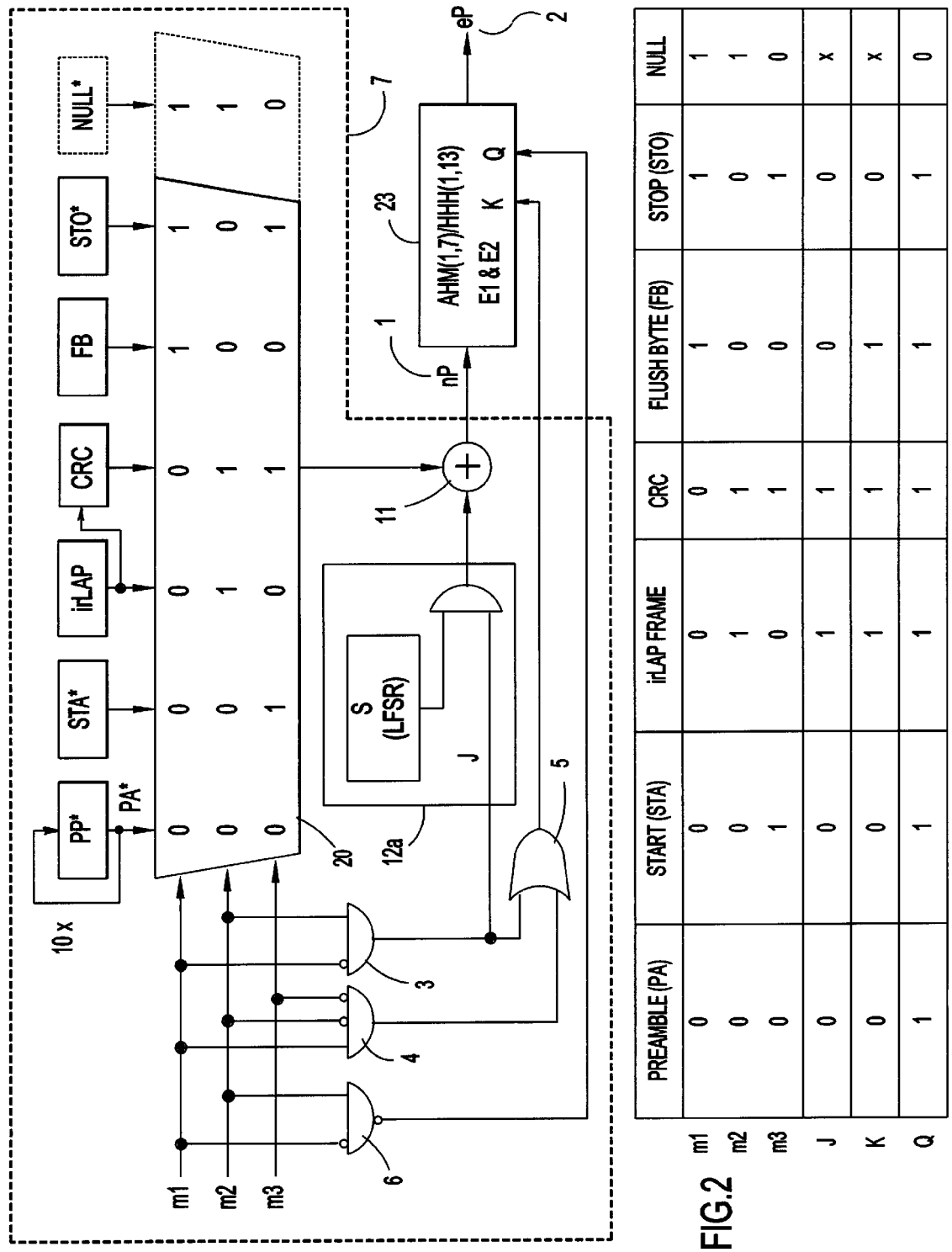
FIG. 2 shows a schematic illustration of an arrangement according to the present invention for entire packet frame assembly prior to encoding. Control signals, indicated in the arrangement, for the control of the respective frame fields are listed in the table below.

With general reference to the figures the essential structure of a scheme for creating an encoded packet frame is described in more detail below. FIG. 1 shows state of the art whilst FIG. 2 represents a packet-frame generator according to the present invention that creates an entire packet frame prior to encoding.

At first, some basics, in accordance with the present invention, are addressed.

The Code

A run-length-limited (RLL) modulation code, hereafter called the HHH(1,13) modulation code, is used in accordance with the present invention to obtain a more efficient system for creating encoded packet frames.

The HHH(1,13) modulation code has its roots in IBM's well-known (d,k)=(1,7) run-length limited (RLL) code, also referred to as the AHM(1,7) code, that was originally developed for the digital magnetic recording channel. The new rate 2/3 HHH(1,13) modulation code provides specific features that make it suitable for application on the wireless infrared channel. Such a code is presented in the US Patent Application, entitled "A method and means for invertibly mapping binary sequences into rate 2/3 (1, k) run-length-limited coded sequences with maximum transition density constraints", filed on Jul. 13, 1998, presently assigned to the assignee of the instant application and the disclosure of which is incorporated herein by reference. The HHH(1,13) modulation code guarantees for at least one empty chip and at most 13 empty chips between chips containing pulses in a transmitted infrared signal. The code achieves high transmitter power efficiency and enables the receiver to recover the data from signals with systematic pulse-width distortion typically observed under near-field conditions. It is mainly for these two reasons that a new code was needed; the original rate 2/3 AHM(1,7) code is not suited for the wireless infrared channel because it exhibits a non-recoverable catastrophic mode under near-field conditions and has insufficient power efficiency.

The set of variables and Boolean operators that define HHH(1,13) encoding are listed below where increasing indices imply increasing time.

| Definition of HHH(1,13) Encoding: | | |
|---|---|---|
| Data input: *) | $D = (d_1, d_2)$ | {1} |
| *) First data input to be encoded: | $D \equiv \tilde{D} = (\alpha, \beta)$ | {2} |
| Present state: | $S = (s_1, s_2, s_3)$ | {3} |
| Next state: | $N = (n_1, n_2, n_3)$ | {4} |
| Internal data: | $B^1 = (B^1 1, B^1 2) = (b_1, b_2)$ | {5} |
| | $B^2 = (B^2 1, B^2 2) = (b_3, b_4)$ | {6} |
| | $B^3 = (B^3 1, B^3 2) = (b_5, b_6)$ | {7} |
| Internal codeword symbol: | $C = (c_1, c_2, c_3)$ | {8} |
| Encoder output symbol: | $Y = (Y_1, Y_2, Y_3)$ | {9} |
| Initial Conditions (start up): | $S = (s_1, s_2, s_3) = (1, 0, 0)$ | |
| | when $B^1 = (b_1, b_2) \equiv \tilde{D} = (\alpha, \beta)$ | |
| Boolean operator notation: | $\overline{m}$ = INVERSE (m) | {11} |
| | $m + n$ = m OR n | {12} |
| | $m \, n$ = m AND n | {13} |

The components of next state $N=(n_1, n_2, n_3)$ and internal codeword symbol $C=(c_1, c_2, C_3)$ can be computed in terms of the components of $S$, $B^1$, $B^2$, $B^3$, with the following Boolean expressions:

$$n_1 = (s_1 s_3) + (s_3 b_1) + (\overline{s_1} b_1 b_2 \overline{b_3}) + (\overline{s_1} b_1 b_2 \overline{b_4} b_5 b_6) \quad \{E\text{-}a\}$$

$$n_2 = (\overline{s_3} b_1) + (s_1 s_2 b_1 \overline{b_2}) \quad \{E\text{-}b\}$$

$$n_3 = (\overline{s_3} b_2) + (\overline{s_1 b_1} b_2) + (s_1 s_2 b_1 \overline{b_2}) \quad \{E\text{-}c\}$$

$$c_1 = \overline{s_1} s_2 \quad \{E\text{-}d\}$$

$$c_2 = \overline{s_1 s_2 c_3} \quad \{E\text{-}e\}$$

$$c_3 = [\overline{s_1} s_3 (\overline{b_1 + b_2})] + (\overline{s_1 s_3 b_1 b_2 b_3} b_4) \quad \{E\text{-}f\}$$

The equations {E-a} to {E-f} are utilizable in a conventional implementation of HHH(1,13) encoder.

Composite Modulation Code

The set of equations specifying HHH(1,13) encoding can be modified such that they combine both AHM(1,7) and HHH(1,13) encoding. While all the defining equations {1} to {13} remain unchanged, a binary control variable K is introduced in the components $n_1$ in {E-a} and $c_3$ in {E-f}. Furthermore q, a second binary control variable, is introduced in all components of N in {E-a/b/c} to enable generation of unlimited runs of internal codeword symbols $C=(c_1, c_2, c_3)=(0, 0, 0)$. The resulting modified Boolean expressions for next state N and inner codeword symbol C are shown below in {E1-a/b/c} and {E2-a/b/c}, respectively, this set of equations together with definitions {1} to {13} describe a dual-mode Composite Modulation Code (CMC):

$$n_1 = \overline{q} + [(s_1 s_3) + (s_3 b_1) + (K\overline{s_1} b_1 b_2 \overline{b_3}) + (K\overline{s_1} b_1 b_2 \overline{b_4} b_5 b_6)] \quad \{E1\text{-}a\}^{1),2)}$$

$$n_2 = q[(\overline{s_3} b_1) + (s_1 s_2 b_1 \overline{b_2})] \quad \{E1\text{-}b\}^{2)}$$

$$n_3 = q[(\overline{s_3} b_2) + (\overline{s_1 b_1} b_2) + (s_1 s_2 b_1 \overline{b_2})] \quad \{E1\text{-}c\}^{2)}$$

$$c_1 = \overline{s_1} s_2 \quad \{E2\text{-}a\}$$

$$c_2 = \overline{s_1 s_2 c_3} \quad \{E2\text{-}b\}$$

$$c_3=[\overline{s_1s_3(\overline{b_1}+\overline{b_2})}]+(K\overline{s_1s_3}b_1b_2\overline{b_3}b_4) \qquad \{E2\text{-}c\}^{1)}$$

[1] K=0 for AHM(1,7) encoding and K=1 for HHH(1,13) encoding.
[2] q=0 for $(n_1, n_2, n_3)=(1, 0, 0)$ and q=1 for AHM(1,7) or HHH(1,13) encoding.

Based on the equations {E1-a/b/c} and {E2-a/b/c} a combined AHM(1,7)/HHH(1,13) encoder can be designed using the dual-mode CMC functions of combined AHM(1, 7)/HHH(1,13) coding.

The following Table 1 shows the mapping of input data [bits] to corresponding codewords [chips] for combined AHM(1,7)/HHH(1,13) encoding. With K=0/q=1, the encoding equations {E1-a/b/c} and {E2-a/b/c} generate the AHM(1,7) codewords #1 to #8, and with K=1/q=1, they generate the HHH(1,13) codewords s#1 to #14. Increasing indices of the input and output variables imply increasing time.

TABLE 1

| # | \multicolumn{4}{c|}{Input Data [bits]} | | | | \multicolumn{4}{c|}{AHM(1,7)/HHH(1,13) Codeword [chips]} | | | | K |
|---|---|---|---|---|---|---|---|---|---|
| | $d_1d_2$ | $d_3d_4$ | $d_5d_6$ | $d_7d_8$ | $y_1y_2y_3$ | $y_4y_5y_6$ | $y_7y_8y_9$ | $y_{10}y_{11}y_{12}$ | q = 1 |
| 1 | 0 0 | | | | 0 1 0 | | | | 0 or 1 |
| 2 | 0 1 | | | | 0 0 1 | | | | 0 or 1 |
| 3 | 1 0 | | | | 1 0 0 | | | | 0 or 1 |
| 4 | 1 1 | | | | 1 0 1 | | | | 0 or 1 |
| 5 | 0 1 | 1 0 | | | 0 0 1 | 0 0 0 | | | 0 or 1 |
| 6 | 0 1 | 1 1 | | | 0 1 0 | 0 0 0 | | | 0 or 1 |
| 7 | 1 1 | 1 0 | | | 1 0 1 | 0 0 0 | | | 0 or 1 |
| 8 | 1 1 | 1 1 | | | 1 0 0 | 0 0 0 | | | 0 or 1 |
| 9 | 0 0 | 1 1 | 0 0 | | 0 1 0 | 0 0 0 | 0 0 0 | | 1 |
| 10 | 0 0 | 1 1 | 0 1 | | 0 0 1 | 0 0 0 | 0 0 0 | | 1 |
| 11 | 1 0 | 1 1 | 0 0 | | 1 0 0 | 0 0 0 | 0 0 0 | | 1 |
| 12 | 1 0 | 1 1 | 0 1 | | 1 0 1 | 0 0 0 | 0 0 0 | | 1 |
| 13 | 0 0 | 1 1 | 1 0 | 1 1 | 0 1 0 | 0 0 0 | 0 0 0 | 0 0 0 | 1 |
| 14 | 1 0 | 1 1 | 1 0 | 1 1 | 1 0 0 | 0 0 0 | 0 0 0 | 0 0 0 | 1 |

The HHH(1,13) modulation code can be viewed as having 14 codewords where the mappings for codewords #1 to #8 are identical with the mappings for the AHM(1,7) code. Table 1 above is consistent with the set of modified encoding equations {E1-a/b/c} and {E2-a/b/c}, respectively.

Packet Frames

Each packet frame either encoded or non-encoded comprises by definition several frame fields: a preamble field, a start field, a data field, a check field, a flush field, a stop field, and a null field. The preamble field, the start field, the flush field, the stop field, and the null field have their specific patterns and comprise control data. Utilizable data are meant to comprise at least part of the content of the data field and the check field. The content of the data field and the check field is normally scrambled before encoding. The check field for a cyclic redundancy check is then calculated before the data field is scrambled.

FIG. 1 shows a schematic illustration of a basic conventional scheme for packet frame assembly that uses multiplexing of specific stored patterns of frame fields as indicated by the respective labeled boxes. The Infrared Data Association (IrDA) standard for the IrDA Serial Infrared Physical Layer Specification to support a 16 Mb/s data rate extension, that specifies the HHH(1,13) modulation code, defines the packet format and its individual frame fields as follows: preamble field (PA), start field (STA), data field (IrLAP), check field (CRC), flush field (FB), stop field (STO), and null field (NULL). A conventional implementation comprises at least two multiplexers, since the data field (IrLAP), check field (CRC), and flush field (FB) are multiplexed by a first multiplexer 10 and after encoding thereof there is a second multiplexer 14 for outputting an entire encoded packet frame (2). Referring to FIG. 1, the first multiplexer 10 is able to receive a first control signal (p1) and a second control signal (p2). Also, the first multiplexer 10 receives the indicated frame fields: data field (IrLAP), check field (CRC) that is calculated from the data field as indicated by a line between the data field (IrLAP) and the check field (CRC), and the flush field (FB). The output of the first multiplexer 10 is led via an adder 11 to a HHH(1,13) encoder 13, also referred to as encoder state machine (ESM). A scrambler 12 that can be a linear feedback shift register, also abbreviated to LFSR, receives also the first control signal (p1) and influences therewith the adder 11 that can be implemented as a Boolean XOR operation for modulo-2 addition. The output of the HHH(1,13) encoder 13 is guided to the second multiplexer 14. This second multiplexer 14 is controlled by a third control signal (p3), a fourth control signal (p4) and a fifth control signal (p5). By the way, the control signals (p1, p2, p3, p4, p5) are generated by a finite state machine (FSM). The second multiplexer 14 is able to receive the specific patterns of the pre-stored frame fields: preamble field (PA), start field (STA), stop field (STO), and null field (NULL). These frame fields are stored in the encoded form in respective memory cells, as indicated by the boxes named with the respective frame field. In other words, the frame fields: preamble field (PA), start field (STA), stop field (STO), and null field (NULL) are defined in the form of specific modulation (chip) sequences which are designed to be directly transmitted over the channel. A logical '1' in these fields means that the transmitted channel chip carries a pulse and a logical '0' means an empty chip is transmitted. On the other hand, the data field (IrLAP) and the check field (CRC) are binary data (bit) sequences that are both scrambled by use of the scrambler 12 and the adder 11 and then sent to the HHH(1,13) encoder 13 before being transmitted as HHH(1,13) encoded chip sequences as part of the encoded packet frame (2). In contrast, the flush field (FB) is not scrambled but directly sent to the HHH(1,13) encoder 13. The second multiplexer 14 outputs finally the encoded packet frame (2) as indicated by the letters eP.

Generally, such a scheme, as indicated with reference to FIG. 1, requires at least two types of multiplexers (10, 14), one for partial assembly of data related fields in the data input domain of the HHH(1,13) encoder 13 and a second one for final assembly of the packet frame in the modulation signal domain.

Packet-frame Generation in the Data input Domain

FIG. 2 shows a schematic illustration of a packet-frame generator according to the present invention for entire packet frame assembly prior to encoding. The same numbering and labeling for the same elements is used. The table below shows the control signals as indicated in the figure for control purposes of the respective frame fields.

Before the packet-frame generator is described in more detail a definition of equivalent data input sequences is given. These data input sequences, also referred to as non-encoded packet frames, are defined for the generation of sequences in the modulation signal domain, also referred to as encoded packet frames, which can be derived from the codeword-list in Table 1. Input domain means prior to encoding whereas signal domain stands for modulated signals, i.e. encoded packet frames. Moreover, a non-encoded packet frame (1) comprises non-encoded control data and non-encoded utilizable data. On the other hand, the encoded packet frame (2) comprises encoded control data and encoded utilizable data. Generally, utilizable data means data transmitted within the data field (IrLAP) and check field (CRC), whereas control data are transmitted within the other frame fields.

The above mentioned frame fields: preamble field (PA), start field (STA), stop field (STO), and null field (NULL) are newly defined such that these fields have an equivalent data input sequence, which means non-encoded control data.

Non-encoded Preamble Field (PA*):
   The non-encoded preamble field (PA*) can be constructed by concatenating ten times (10×) the 16-bit data-preamble period (PP*), where
   PP*='10'00'00'01'01'01'10'10',
to form a complete 160-bit data-preamble period (PA*)
   PA*='PP*'PP*'PP*'PP*'PP*'PP*'PP*'PP*'PP*'PP*'.
The left-most/right-most bit of PP* and PA*, respectively, is encoded first/last.

Similarly, in lieu of the start field (STA) and stop field (STO) delimiters it is defined to have the equivalent data input delimiters non-encoded start field (STA*) and non-encoded stop field (STO*), respectively:

Non-encoded start field (STA*):
   The non-encoded start field (STA*) delimiter can be a 32-bit sequence
   S TA * = '10'11'00'10'10'01'11'01'01'00'11'01'10'01'01'11',
   or as an alternative for more flexibility also
   S TA * = '01'11'01'01'01'00'11'01'10'00'00'11'00'00'01'11'.
When the alternative is applied, then the frame fields: data field (IrLAP), check field (CRC), flush field (FB), and non-encoded stop field (STO*) can be replaced by differently defined frame fields.

Non-encoded stop field (STO*):
   The non-encoded stop field (STO*) delimiter can be a 32-bit sequence
   STO*='01'01'00'11'01'10'11'11'10'11'00'10'11'11'11'11'.
It should be noted that the left-most/right-most bit of STA* and STO* are encoded first/last.

Non-encoded null field (NULL*):
   The equivalent non-encoded null field (NULL*) is only defined as a virtual data input field; its implied virtual length can be 26 bits. The first 16 bits represent the equivalent 24-chip null field (NULL) in the modulation signal domain and the last 10 bits are used to compensate for the encoder delay of five encoding cycles. There is no need to physically implement this field. This virtual field has merely a conceptual meaning and the purpose to force definition of appropriate control signals that ensure generation of a NULL field at the end of a frame.

In general, the frame fields can be defined in several ways but they should always meet the applied coding rules.

Referring to FIG. 2, a main multiplexer 20 is able to receive a first control signal (m1), a second control signal (m2), and a third control signal (m3). The main multiplexer 20 receives the above indicated frame fields: non-encoded preamble field (PA*), non-encoded start field (STA*), data field (IrLAP), check field (CRC), flush field (FB), non-encoded stop field (STO*), and non-encoded null field (NULL*). The sign * indicates that the respective frame fields are not encoded, as can be seen in FIG. 2. These non-encoded frame fields show the advantage that they are smaller than the pre-stored equivalent encoded frame fields as shown with reference to FIG. 1. Hence, such non-encoded frame fields require less storage space. The check field (CRC) can be calculated from the content of the data field (IrLAP) as indicated by the connecting line. The non-encoded frame fields: data field (IrLAP) and check field (CRC) are referred to as non-encoded utilizable data whereas the non-encoded preamble field (PA*), non-encoded start field (STA*), flush field (FB), non-encoded stop field (STO*), and non-encoded null field (NULL*) are referred to as non-encoded control data. The output of the main multiplexer 20 is led via the adder 11 to a modulation encoder 23, also referred to as CMC encoder 23, that combines the above described AHM(1,7)/HHH(1,13) encoding functions. A first logic element 3 controlled by the first control signal (m1) and a second control signal (m2) outputs a control signal J that is led to the input of a J-signal-based scrambler 12a. As can be seen from the table below only the data field (IrLAP) and the check field (CRC) are scrambled for randomization if the control signal J is "1" or active. All non-encoded frame fields are multiplexed in a defined order by the multiplexer 20 and guided via the adder 11 as non-encoded packet frame (1) to the input of the CMC encoder 23 that after encoding finally outputs the encoded packet frame (2), as indicated by the letters eP. The letters nP indicate the non-encoded packet frame (1) prior to encoding that has been assembled by assembling means 7. The encoded packet frame (2) comprises encoded control data and encoded utilizable data and therewith all frame fields in encoded form. The CMC encoder 23 is controlled by a control signal Q and a control signal K and has here at its input side two input lines and at its output side three output lines, which for the sake of clarity are not depicted. By the way, a control signal q in the equations {E1-a/b/c} and Table 1 is generated from control signal Q by delaying said control signal Q by three encoding intervals, for example. One encoding interval corresponds to encoding of two data bits into three encoded chips. A first enabling-signal input (Q) receives the control signal Q and a second enabling-signal input (K) receives the control signal K. If the control signal Q is logical "0" at the first enabling-signal input (Q) then the second enabling-signal input (K) is redundant. On the other hand, if the control signal Q is logical "1"at the first enabling-signal input (Q) the n the CMC encoder (23) c an be switched between the first modulation code and the second modulation code by the control signal K at the second enabling-signal input (K). The control signal K is created form the control signals (m1, m2, m3), also referred to as control means, by use of a second logic element 4, a third logic element 5 that here is an OR gate, and the first logic element 3. On the other hand, the control signal Q is created form the first control signal (m1) and the second control signal (m2) by use o f a third logic element 6 that here is a NAND gate. The control signals (m1, m2, m3) are generated by a finite state machine again.

As an extension of the present invention, a packet-frame disassembler for separating a received encoded packet frame (2) at the receiver side can be realized in a reverse manner in order to obtain also the advantages of the present invention. Such a packet-frame dismantler comprises then a decoder for decoding the received encoded packet frame (2) to a non-encoded packet frame (1) and further the packet-frame disassembler comprises a separator for separating the non-encoded packet frame (1) to non-encoded control data and non-encoded utilizable data. This is possible if the encoded packet frame (2) has been created according to the present invention.

What is claimed is:

1. A packet-frame generator for creating an encoded packet frame comprising encoded control data and encoded utilizable data, whereby a non-encoded packet frame comprising non-encoded control data and non-encoded utilizable data is providable by an assembling means, said packet-frame generator comprising a modulation encoder which comprises:

a first modulation encoder component for encoding said non-encoded control data by a first modulation code; and a second modulation encoder component for encoding said non-encoded utilizable data by a second modulation code thereby creating said encoded packet frame.

2. Packet-frame generator according to claim 1, whereby the non-encoded packet frame comprises different frame fields in a defined sequence, said different frame fields being completely assemblable to said non-encoded packet frame before encoding.

3. Packet-frame generator according to claim 2, whereby the non-encoded packet frame comprises at least the following frame fields: a non-encoded preamble field (PA*), a non-encoded start field (STA*), a data field (IrLAP), a check field (CRC), a flush field (FB), and a non-encoded stop field (STO*), and whereby said non-encoded preamble field (PA*), said non-encoded start field (STA*), said flush field (FB), and said non-encoded stop field (STO*) having a specific pattern.

4. Packet-frame generator according to claim 1, whereby the non-encoded packet frame comprises at least the following frame fields: a non-encoded preamble field (PA*), a non-encoded start field (STA*), a data field (IrLAP), a check field (CRC), a flush field (FB), and a non-encoded stop field (STO*), and whereby said non-encoded preamble field (PA*), said non-encoded start field (STA*), said flush field (FB), and said non-encoded stop field (STO*) having a specific pattern.

5. Packet-frame generator according to claim 1, whereby the assembling means comprises logic means and control means for mapping the non-encoded control data and the non-encoded utilizable data to an input of the modulation encoder.

6. Packet-frame generator according to claim 1, whereby the assembling means comprises a computer program.

7. Packet-frame generator according to claim 1, whereby the nonencoded utilizable data are scramblable by use of a scrambler which provides input to said modulation encoder.

8. Packet-frame generator according to claim 1 further comprising storage means for storing the non-encoded control data.

9. Packet-frame generator according to claim 1, whereby the first modulation code is a run length limited code comprising eight codewords and said second modulation code is a run length limited code comprising fourteen codewords, and whereby further said second modulation code is reducible to said first modulation code, preferably by using said eight codewords which are part of said fourteen codewords.

10. Packet-frame generator according to claim 1, whereby the non-encoded packet frame is assemblable and encodable for transmission over a channel, preferably an infrared channel.

11. Packet-frame generator according to claim 1, whereby the modulation encoder causes a time delay of at least three clock cycles.

12. Packet-frame generator according to claim 1, whereby the modulation encoder has at least one input line and at least one output line, and further a first enabling-signal input (Q) and a second enabling-signal input (K), a first value at said first enabling-signal input (Q) makes said second enabling-signal input (K) redundant and if a second value is provided to said first enabling-signal input (Q) then the modulation encoder is switchable between the first modulation code and the second modulation code by a mode signal at said second enabling-signal input (K).

13. Packet-frame generator according to claim 1, whereby the modulation encoder comprises a mapping table for at least the second modulation code.

14. A magnetic recording system comprising a packet-frame generator for creating an encoded packet frame comprising encoded control data and encoded utilizable data, whereby a non-encoded packet frame comprising non-encoded control data and non-encoded utilizable data is providable by an assembling means, said packet-frame generator comprising a modulation encoder which comprises:

a first modulation encoder component for encoding said non-encoded control data by a first modulation code; and a second modulation encoder component for encoding said non-encoded utilizable data by a second modulation code thereby creating said encoded packet frame.

15. A method for creating an encoded packet frame comprising encoded control data and encoded utilizable data, said method comprising the steps of:

assembling a non-encoded packet frame, that comprises non-encoded control data and non-encoded utilizable data, encoding said non-encoded control data by a first modulation code and said non-encoded utilizable data by a second modulation code; and providing said encoded control data and said encoded utilizable data as said encoded packet frame for further processing.

16. Method according to claim 15, wherein at least one step is realized in form of a computer program.

17. A computer program comprising program code means for performing a method for creating an encoded packet frame comprising encoded control data and encoded utilizable data, said method comprising the steps of:

assembling a non-encoded packet frame, that comprises non-encoded control data and non-encoded utilizable data, encoding said non-encoded control data by a first modulation code and said non-encoded utilizable data by a second modulation code; and providing said encoded control data and said encoded utilizable data as said encoded packet frame for further processing.

18. A method in a processing system for creating an encoded packet frame comprising encoded control data and encoded utilizable data, wherein said data processing system includes an operating system, said method comprising the steps of:

assembling a non-encoded packet frame, said non-encoded packet frame comprises non-encoded control data and non-encoded utilizable data;

encoding said nonencoded control data by a first modulation code and said non-encoded utilizable data by a second modulation code; and providing said encoded control data and said encoded utilizable data as said encoded packet frame for further processing.

19. Computer readable code means for causing a processing system to effect a method for the generation of an encoded packet frame comprising encoded control data and encoded utilizable data, said method comprising the steps of:

assembling non-encoded control data and non-encoded utilizable data in a defined order to an non-encoded packet frame for further processing in a modulation encoding means using a first modulation code for encoding said non-encoded control data and a second modulation code for encoding said non-encoded utilizable data; and providing said encoded packet frame at an output of said modulation encoding means.

20. Packet-frame disassembler for separating a received encoded packet frame comprising encoded control data and encoded utilizable data, said packet-frame dismantler comprising:

a decoder for decoding said received encoded packet frame to a non-encoded packet frame; and a separator for separating said non-encoded packet frame to non-encoded control data and non-encoded utilizable data, whereby said encoded control data are encoded by a first modulation code and said encoded utilizable data are encoded by a second modulation code.

* * * * *